United States Patent [19]

Sheffer

[11] Patent Number: 4,716,361
[45] Date of Patent: Dec. 29, 1987

[54] CAPACITANCE MEASURING METHOD AND APPARATUS

[75] Inventor: Tzafrir Sheffer, Seattle, Wash.

[73] Assignee: John Fluke Mfg. Co., Inc., Everett, Wash.

[21] Appl. No.: 743,622

[22] Filed: Jun. 11, 1985

Related U.S. Application Data

[63] Continuation-in-part of Ser. No. 668,622, Nov. 5, 1984, abandoned.

[51] Int. Cl.⁴ .............................................. G01R 27/00
[52] U.S. Cl. ................................ 324/60 R; 324/60 C; 340/347 CC
[58] Field of Search ............. 324/DIG. 1, 60 C, 61 R, 324/60 CD, 60 R; 340/347 C, 347 CC

[56] References Cited

U.S. PATENT DOCUMENTS

| | | | |
|---|---|---|---|
| 3,984,766 | 10/1976 | Thornton | 324/61 R |
| 4,251,767 | 2/1981 | Montana | 324/60 C |
| 4,323,972 | 4/1982 | Winter | |
| 4,339,709 | 7/1982 | Brihier | 324/61 R |

FOREIGN PATENT DOCUMENTS

| | | | |
|---|---|---|---|
| 0076392 | 4/1983 | European Pat. Off. | |
| 635674 | 4/1950 | United Kingdom | |
| 797542 | 7/1958 | United Kingdom | |
| 969384 | 9/1964 | United Kingdom | |
| 1085807 | 10/1967 | United Kingdom | |
| 1542258 | 3/1979 | United Kingdom | 324/60 C |
| 2079959 | 1/1982 | United Kingdom | |

OTHER PUBLICATIONS

Analog Devices Databook 1982, ADC Chapter.

Primary Examiner—Reinhard J. Eisenzopf
Assistant Examiner—Jose M. Solis
Attorney, Agent, or Firm—John P. Dellett; Mikio Ishimaru

[57] ABSTRACT

An apparatus for performing ratiometric capacitance measurements by comparing the output of a digital-to-analog converter with the voltage at a tap between an unknown capacitance and a first inherent capacitance of the apparatus. A common input voltage is supplied to both the series circuit, including the first inherent and unknown capacitances, and to the digital-to-analog converter which accomplishes attenuation of the input voltage in response to a digital value. The digital value is generated by a successive approximation register supplying a digital output relating the unknown capacitance to the known capacitance. The apparatus is adapted to ratiometrically measure the first inherent capacitance by supplying the common input voltage to a series circuit, including a known reference capacitance and the first inherent capacitance, such that the digital output of the successive approximation register relates the first inherent capacitance to the reference capacitance. The apparatus is further adapted to ratiometrically measure a second inherent capacitance by supplying the common input voltage to a series circuit, including the first and second inherent capacitances, such that the digital output of the successive approximation register relates the second inherent capacitance to the first inherent capacitance. The measured value of the unknown capacitance is then corrected by the amount of the second inherent capacitance appearing in parallel with the unknown capacitance during measurement thereof with reference to the first inherent capacitance.

10 Claims, 5 Drawing Figures

CAPACITANCE MEASURING METHOD AND APPARATUS

This application is a continuation-in-part of application Ser. No. 668,622, filed Nov. 5, 1984 and now abandoned.

BACKGROUND OF THE INVENTION

Instruments for measuring impedance values desirably have the ability of making the required measurements when the device under test is powered down, i.e. with the measuring instrument providing whatever power is necessary for the measurement. However, devices which may be tested represent a wide range of voltage requirements and limitations. For instance, if pn junctions are included in a circuit under test, any applied voltage must be sufficiently low to prevent damage or undesirable turn on of the pn junctions. Because of the variable value of the excitation voltage required and because of a desire to avoid, if possible, switching of meter ranges, it is advantageous to measure the impedance ratiometrically, i.e. in terms of a standard impedance rather than in terms of the applied voltage.

Apparatus has been available heretofore for making ratiometric impedance measurements, but such apparatus has usually required fairly complicated and expensive circuitry in order to provide a digital output reading. Thus, a conventional bridge circuit or an electronic analog thereof can measure an impedance in terms of a second or standard impedance. Also, computer circuits are available which measure the voltage drop across an unknown impedance and a standard impedance and which then perform a calculation for the ratio between the two. This approach has a speed governed by the speed and complexity of the computer.

The desirable elimination of switching between different measurement ranges has also heretofore required some scheme to compress the measurement scale. In the past, a logarithmic amplifier has been employed, but unfortunately such an amplifier tends to be unstable, inaccurate, expensive, and occupies considerable printed circuit board area.

As the density of circuit boards has increased, a need has also arisen for test equipment capable of more rapidly measuring impedances, particularly small capacitances, between large numbers of points on each board without compromising measurement accuracy. To increase measurement speed and to reduce the bulk of multipoint impedance testing equipment, designers have eliminated mechanical switches for connecting test point probes with impedance measurement apparatus and have substituted high speed, high density, integrated solid state switches. However, solid state switches typically have comparatively high resistance, leakage, and capacitance which can introduce significant measurement error. Small value capacitance (<0.01 microfarads) measurement is particularly troublesome due to stray capacitance in interconnecting switching networks and in some part due to the capacitance of long cables connecting test stations to remote mainframes containing measurement equipment.

What is needed is a method and apparatus for high speed measurement of impedances, particularly small capacitances, between many points on a circuit board wherein the effects of inherent capacitance of the measurement apparatus are minimized.

SUMMARY OF THE INVENTION

In accordance with the present invention in a particular embodiment thereof, a predetermined voltage source, which may be adjusted in accordance with the requirements of the device under test, is coupled to the series combination of an unknown impedance and a standard impedance. The same input voltage is also adjustably attenuated in accordance with a digital value derived through successive approximation. The attenuated voltage is compared with a voltage drop associated with the standard impedance, and as a result of this comparison, a digital value is finally determined to supply a measure of the unknown impedance in terms of its ratio to the standard impedance.

In particular, the successively approximated digital value is supplied by means of a register wherein binary digits successively determine the degree of attenuation of the predetermined voltage before comparison thereof with the voltage across the unknown impedance. For example, binary digits are progressively generated, starting with the highest order digit, and each brings about attenuation of the aforementioned voltage in inverse proportion to the value of the binary digit. Successive comparisons are made and a binary number is accumulated which represents the ratiometric value of the unknown impedance in terms of the standard impedance. The process is very fast, requiring a number of clock cycles equal only to the number of output digits (the resolution) provided by the successive approximation register. The technique is economical in terms of component parts and relatively uncomplex as compared with prior art devices. Also, desirable scale compression is accomplished, with considerable accuracy, avoiding the employment of logarithmic amplifiers and the like.

In an embodiment of the invention, unknown capacitances to be measured are accessed through a bus and a multiplexing circuit for selectively connecting various points on a remotely located device under test to the bus, thereby allowing unknown capacitances between points to be ratiometrically measured in rapid succession. Means are provided to ratiometrically measure inherent capacitance of the bus and multiplexing circuit appearing in series with the unknown capacitance. The measured inherent capacitance is then utilized as the standard impedance in subsequent ratiometric measurement of small value unknown capacitances. Means are also provided to ratiometrically measure inherent capacitance of the bus and multiplexing circuit appearing in parallel with the unknown capacitance. The ratiometric measurement of the small value capacitance is then corrected to account for the effects of the parallel inherent capacitance.

It is accordingly an object of the present invention to provide an improved capacitance measuring method and apparatus permitting fast and accurate measurement of capacitances between a plurality of test points on a circuit board.

It is another object of the present invention to provide an improved ratiometric capacitance measuring method and apparatus permitting accurate measurement of small value capacitances through the use of a smallest possible value of standard capacitance.

It is a further object of the present invention to provide an improved apparatus for measuring capacitances including means to measure the inherent capacitance of the apparatus itself so that the capacitance measurements of the device under test may be corrected to account for the effects of the inherent capacitances.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DRAWINGS

Figure 1:
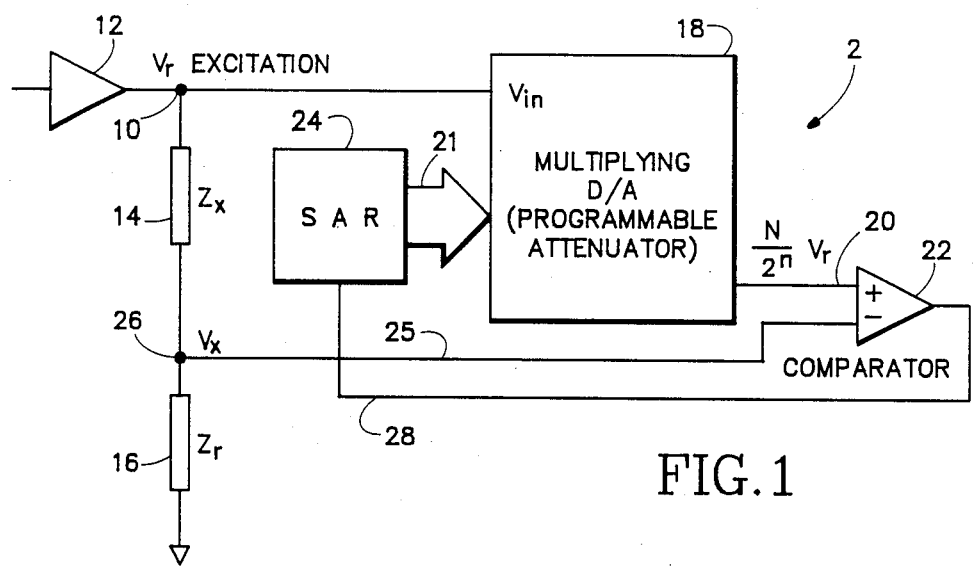
FIG. 1 is a block diagram of an impedance measuring apparatus employed in accordance with the present invention.
Figure 5:
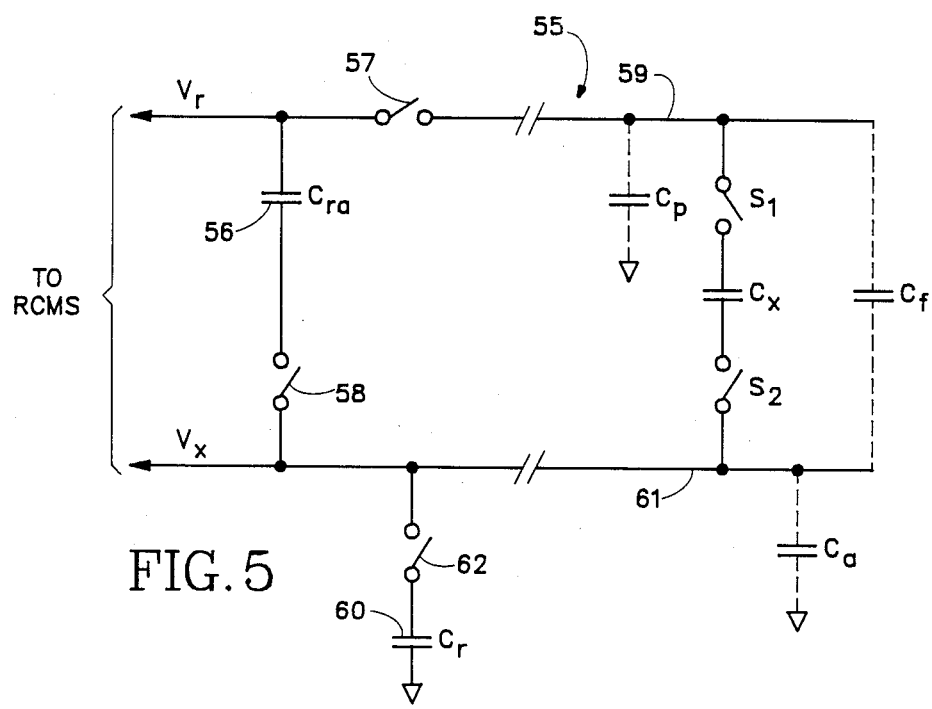
Figure 4:
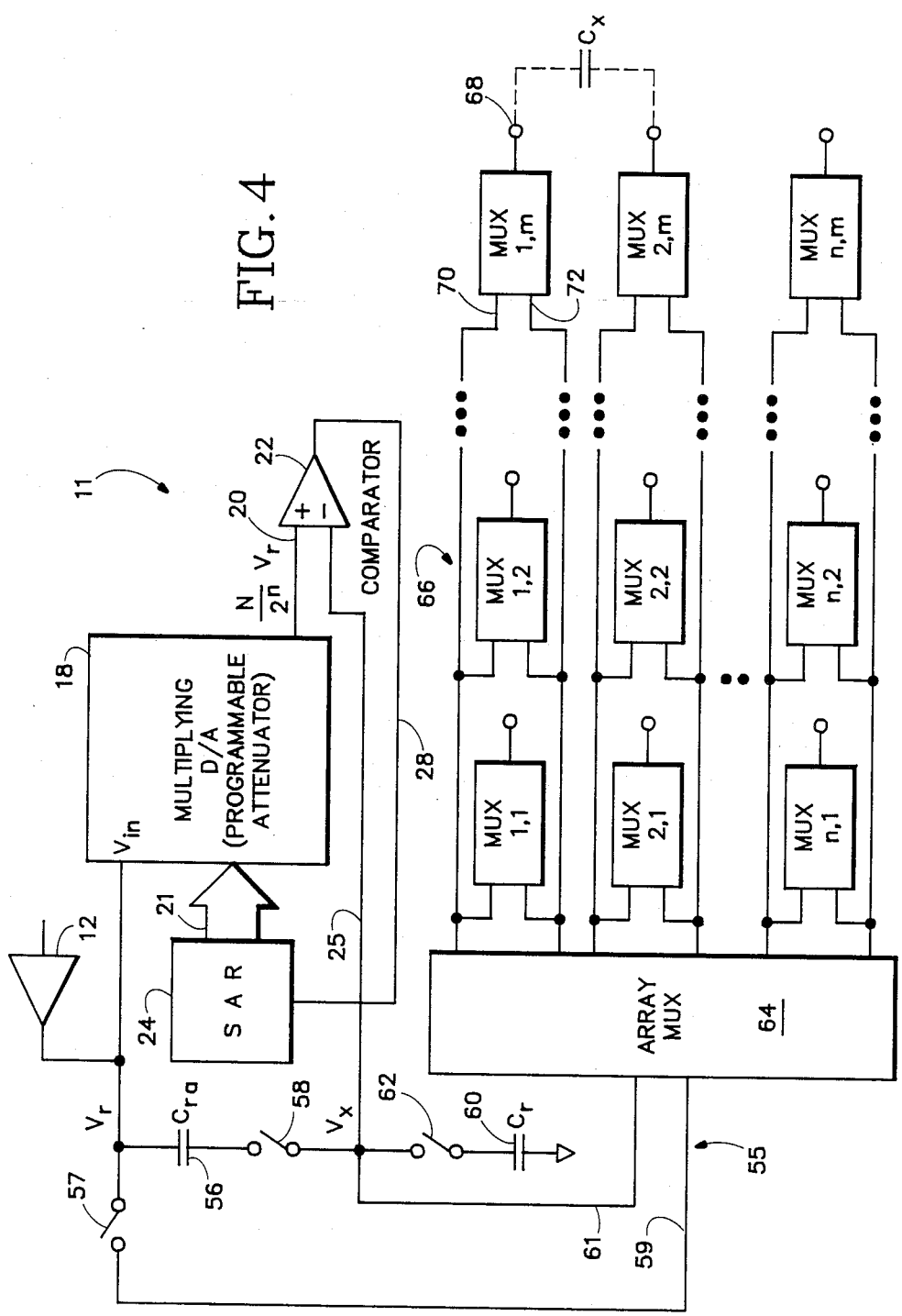

FIG. 4 a block diagram of the impedance measuring apparatus of FIG. 1 further including a bus and a multiplexing network permitting the apparatus to measure in rapid succession impedances between selected points on a device under test; and FIG. 5 is a circuit diagram modeling the impedance of the bus and switching network of FIG. 4.

DETAILED DESCRIPTION

Referring to the drawings and particularly to FIG. 1, illustrating a ratiometric component measurement system (RCMS) in block diagram form, an excitation voltage Vr is provided at node 10 of the circuit from amplifier 12 and this excitation voltage is applied to a series circuit comprising unknown impedance 14 having a value Zx and a standard or known impedance 16 having a value Zr, disposed between node 10 and ground. The same excitation voltage is applied as the reference input of a multiplying D/A converter or programmable attenuator 18 wherein the value, Vr, is attenuated to provide a value on lead 20 in accordance with digital attenuation inputs 21. In particular, the multiplying D/A comprises an R/2R circuit as hereinafter more fully described receiving a plurality of binary, attenuation determining inputs which are supplied from successive approximation register 24. Register 24, which is also hereinafter more fully described, supplies successive binary digits in predetermined order, e.g. descending order, each digit bringing about a proportional degree of conversion in D/A converter 18.

The attenuated output from D/A converter 18 on lead 20 is compared in comparator 22 with the voltage on lead 25 connected to tap 26 between unknown impedance 14 and known impedance 16. Successive approximation register 24 provides output digits in predetermined order, e.g. starting with the most significant bit, and comparator 22 indicates whether the output voltage on lead 20 is greater than the voltage on lead 25. The first (most significant) bit in the output of register 24 is cleared if the voltage on lead 20 is higher. If, on the other hand, the voltage on lead 25 is higher, the most significant bit is retained as an input to D/A converter 18. In either case register 24 then supplies a next most significant bit output to D/A converter 18 and the sequence is repeated. The digital output 21 from successive approximation register 24 will finally select attenuation in D/A converter 18 causing the attenuated output 20 to correspond substantially to the voltage at tap 26. The digital output of register 24 becomes an accurate representation of the fraction of the excitation voltage which is present at tap 26, and hence an accurate measure of the unknown impedance.

Assuming the impedances are resistances, the conversion result, N, is expressed as follows:

$$Vx/Vr = N/2^n \qquad [1]$$

or $N = Vx2^n/Vr$ where n equals the resolution of D/A converter 18 expressed as an integer. The conversion result, N, is an integer value over the following range:

$$0 <= N < 2^n,$$

and by the nature of the network, $$Vx < Vr.$$

It will be seen from FIG. 1 that:

$$Vx = VrRr/(Rx + Rr) \qquad [2]$$

By substituting equation [2] into equation [1], $$Rx = Rr((2^n/N) - 1) \qquad [3]$$

It will be noted the last expression for the value of Rx is independent of the reference voltage Vr. The only consideration for the reference voltage is that it should be large enough so as to reduce noise, offset and other non-ideal real world effects. At the same time, Vr should be small enough to avoid undesired conduction through pn junctions and the like connected to the resistance under test. In the particular embodiment, Vr is supplied from amplifier 12 and can vary between 40 mv and 10 v without effect on the system accuracy. The unknown value in equation [3] is in terms of N, which is the integer output of successive approximation register 24, and the value of the standard resistance Rr.

The result is obtained very rapidly, the successive approximation register 24 cycling through the number of clock cycles corresponding to its resolution which was 12 in the present example. The final resistance value is ratiometrically determined, i.e. in terms of the standard resistance rather than in terms of a voltage value and is quite accurate. Moreover, the circuit is economical and uncomplicated. Furthermore, the effect of scale compression is also achieved. Observing the transfer function, equation [3], in considering the range of N, an asymptotic relationship is noted which has two boundary values. The first boundary value for N is $2^n - 1$ and the second is 0. At the boundary regions there is an ascending range of component values compressed into a narrowing range of counts. By differentiating equation [3], we can provide an expression of the scaling as a function of N and the reference component:

$$(d/dN)(Rx) = (d/dN)(Rr((2^n/N) - 1)) = -Rr(2^n)(N^{-2}). \qquad [4]$$

Figure 3:
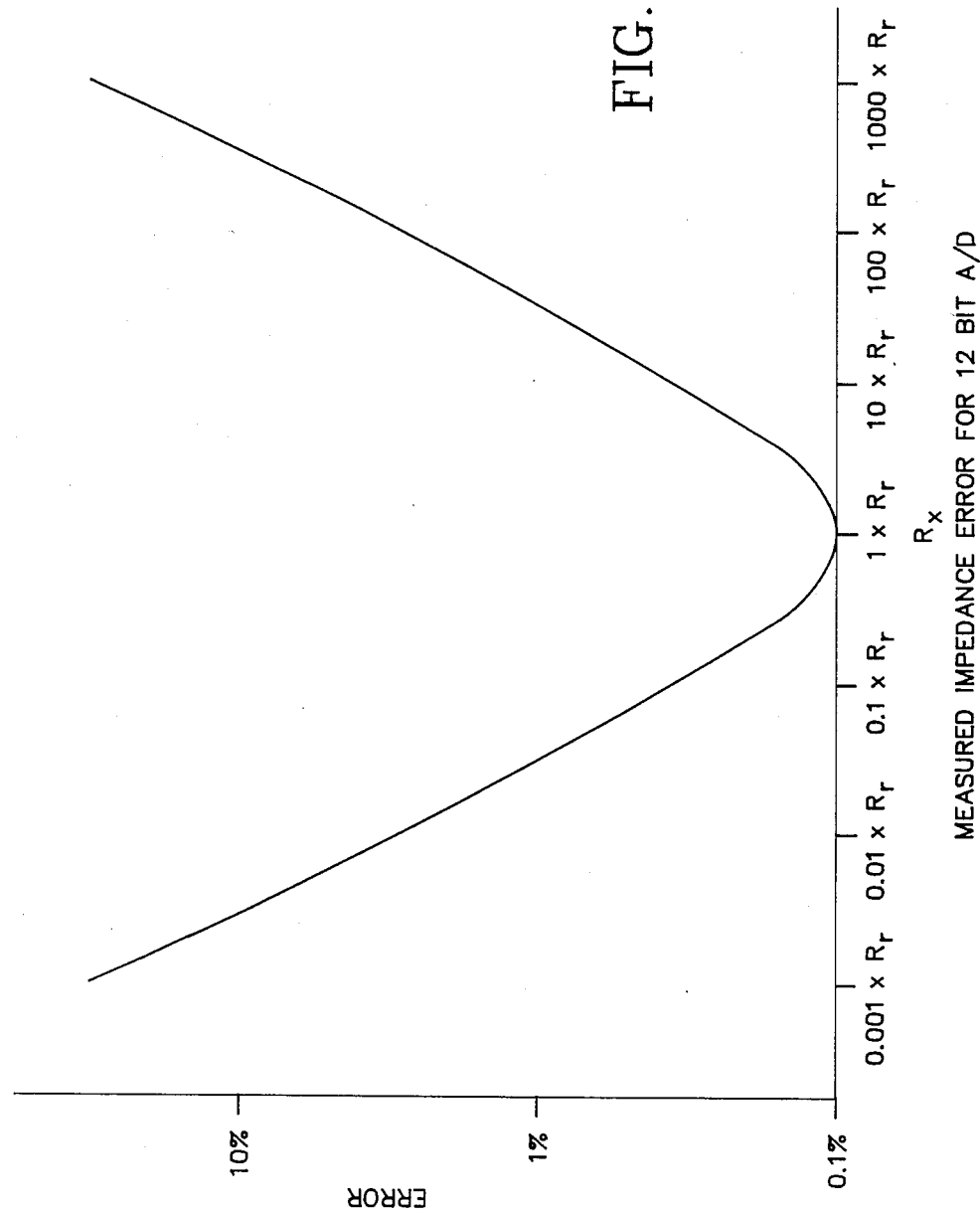
FIG. 3 is a curve plotting percentage error of measurement according to the present method and apparatus as a function of measured impedance.

The percentage error as a function of the measured component and using a 12-bit implementation is plotted in FIG. 3 wherein Rx is an unknown resistance, Rr is a standard resistance, and the error of Rx is plotted logarithmically. The curve provides the single bit error as a function of the resistance at which it is taken. It is observed that for wide ranges of unknown resistances the error is less than one percent.

Figure 2:
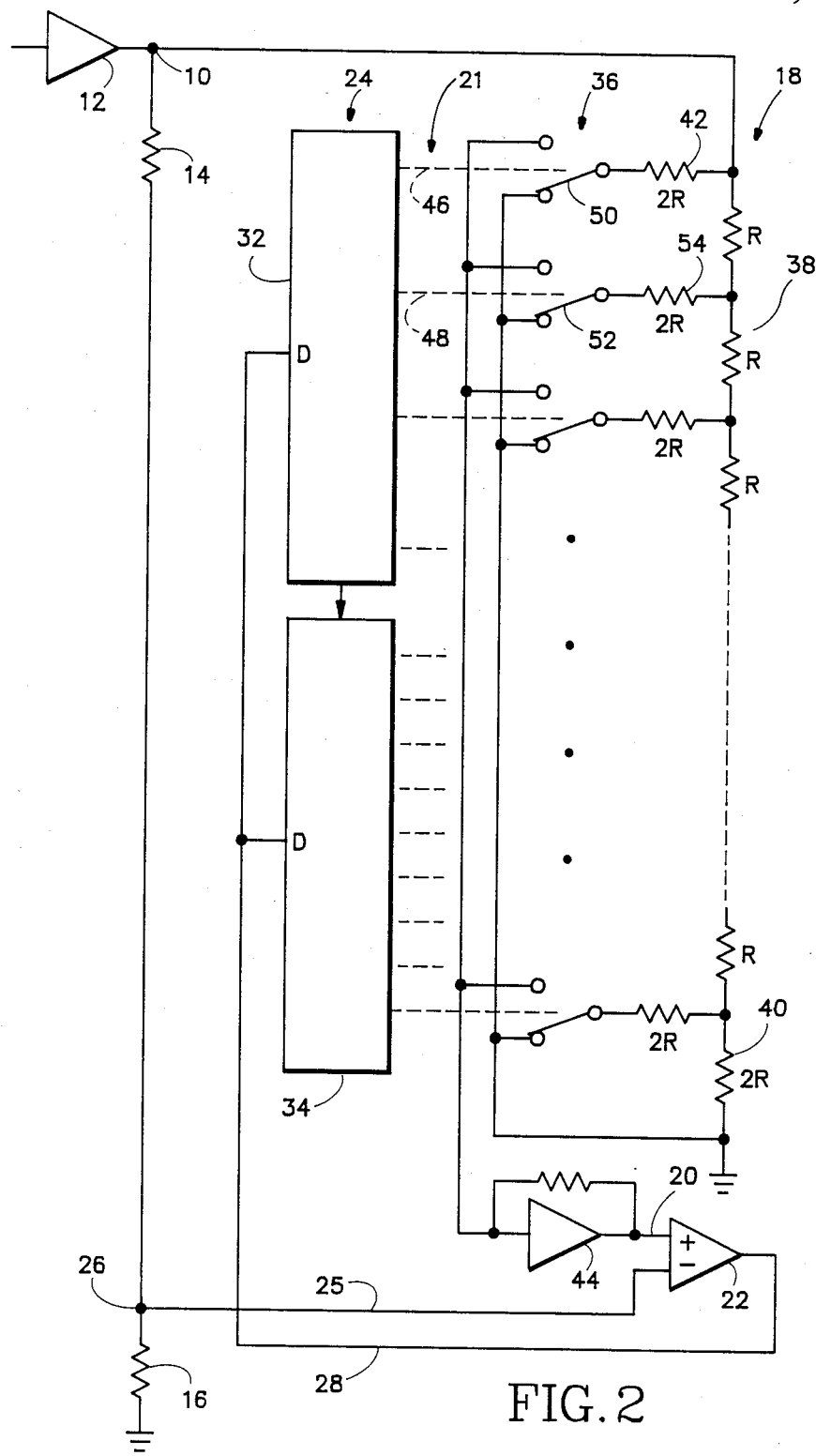
FIG. 2 is a more detailed block and schematic diagram of measuring apparatus.

Referring further to FIG. 2, the circuit is illustrated in greater detail in particular regard to the successive approximation register 24 and D/A converter 18. A particular example of a successive approximation register is manufactured by Motorola and comprises a pair of such registers including a type MC 14559B register indicated at 32 and a type MC 14549B indicated at 34 in the drawing. The comparator 22 output is connected to the data inputs of each register, while the end-of-convert output of register 32 is connected to the start-convert input of register 34. The end-of-convert output of register 34 (not shown) is utilized in a well understood manner to indicate the successive approximation has been completed. The two registers are utilized together to provide a 12 bit output for successively operating switches 36 in D/A converter 18.

D/A converter 18 is suitably a type AD 7541 device manufactured by Analog Devices. It comprises a conventional R/2R network, as shown, wherein the series connection 38 of R values is coupled between node 10 and ground via a final 2R leg 40, while the 2R resistance legs 42 are respectively connected to the input of output amplifier 44 of the device by way of the respective switches 36. The switches 36 actually comprise CMOS switching circuits, included in the converter, which are respectively electronically closed by the binary digital outputs from successive approximation register 24. In the inactive state, the switches 36 are suitably connected to ground.

Reviewing the operation of the circuit, registers 32 and 34 operate to provide successive outputs puts starting on the highest order bit output on lead 46. Such an output closes switch 50 to connect resistor 42 to the input of amplifier 44, and if comparator 22 supplies a data input, D, indicating the voltage at tap 26 is higher than the voltage provided by amplifier 44, then the output bit on lead 46 is retained and the top switch 50 of switches 36 will remain closed. If, on the other hand, the reverse is true, then the output on lead 46 is dropped and switch 50 is opened. Next, the next most significant bit is asserted on lead 48 to close switch 52 whereby resistor 54 (supplying substantially half the current as would be supplied from resistor 50) now also supplies an input to amplifier 44. Again, if the voltage at tap 26 is higher than the output of amplifier 44, the output 48 remains on and switch 52 remains closed. Otherwise, the output on lead 48 is dropped and switch 52 is opened. The process proceeds in binary progression, through 12 binary output bits provided by successive approximation register 24 whereby the final digital outputs at 21 will represent the aforementioned value N from which the value of unknown resistance 14 is readily derived.

Measurement of capacitors can employ the above technique to produce highly accurate and fast results. In this case, measurement relies on charge distribution across a network consisting of an unknown capacitance Cx and a reference capacitance Cr. After both capacitors are discharged, both are charged until Vr reaches a predetermined value, and the charging process is stopped. Since both are charged with the same current for the same period of time, the voltage Vx at tap 26 in FIG. 1 will be:

$$Vx = Vr(1/Cr)/((1/Cr)+(1/Cx)) \quad [4']$$

By substituting equation [4'] into equation [1], $$Cx = CrN/(2^n - N). \quad [5]$$

Again, the value of the voltage or current by which the network is charged does not have any effect on the capacitance measurement. In many instances, this technique eliminates the parasitic effects of line and switch impedances since no currents flow while measurement is in progress.

Measurement of inductors can be accomplished in a ratiometric fashion as well. A reference component of a known value Lr is placed in the position of Zr in the series network. By applying a voltage Vr to the series network, and taking a reading after some settling time, a ratio of the two components Lx and Lr can be derived.

$$\text{Since } V = L(di/dt) \quad [6]$$

$$Vr = (Lx + Lr)(di/dt) \quad [7]$$

$$\text{and } Vx = Lr(di/dt) \quad [8]$$

Substituting [7] and [8] into [1], $$N = (Lr)(di/dt)(2^n)(1/(Lr + Lx)(di/dt)) = \quad [9]$$
$$(Lr)(2^n)(1/(Lr + Lx))$$
$$\text{or, } Lx = Lr((2^n/N) - 1)$$

The excitation voltage Vr is assumed to have no current limit for equation [9] to hold. That is, as long as the driving circuit can sustain sufficient di/dt, equation [9] will hold. In practice, however, the current limit of the voltage driver should be accounted for. Consider the following example for inductance measurement. Let the excitation voltage Vr=0.25 v at a current limit of 15 mA. Let L=10 mh (composite inductor Lx+Lr). Substituting these values into the equation [6] we obtain:

$$di/dt = 25 \text{ amp. per second.}$$

With the above current limit considered: 25 A/sec. = 15 mA/0.6 ms. This means that a measurement should be performed within 0.6 ms after application of the excitation voltage to the network.

FIG. 4 illustrates, in block diagram form, capacitance measuring apparatus according to the present invention adapted for measuring in rapid succession capacitances between a large number of test points on a device under test. The apparatus includes a ratiometric component measurement system (RCMS) 11 as was illustrated in FIG. 1 including a D/A converter 18, a comparator 22, a successive approximation register 24 and an amplifier 12 for generating excitation voltage Vr. An unknown capacitance Cx to be measured is remote from the RCMS 11 but is accessed thereby through a two line bus 55 and a multiplexed array 66.

The multiplexed array 66 comprises a set of n rows of m multiplexers, each multiplexer in the array having three switching states so that it may selectively connect an input terminal 68 to either of two outputs 70 and 72, or may disconnect terminal 68 from either of its two outputs. Each two corresponding outputs of the multiplexers of each array 66 row are connected in parallel to inputs of another multiplexer 64 for selectively connecting any one of its 2 n inputs to a first line 59 of the bus 55 while connecting any other one of its inputs to a second line 61 of the bus.

The inputs 68 to each multiplexer of the array 66 may be connected to various points on a device under test and multiplexers 64, 66 may be set to connect any two such points to the bus 55. Therefore the capacitance Cx to be measured by the RCMS 11 may appear between any two terminals 68 of the array 66 depending on the switching states of the multiplexers. By selectively changing the switching states of the array multiplexers, the impedances between a large number of points on a device under test can be measured by the RCMS 11 in rapid succession.

To perform a ratiometric capacitance measurement, the selected capacitance Cx is connected across the bus 55 by the multiplexer array and the excitation voltage Vr from amplifier 12 is applied to one side of the Cx capacitance through the first line 59 of bus 55, connected to the output of amplifier 12 through a switch 57. The voltage Vx appearing at the other side of capacitance Cx is carried via the second line 61 of the bus coupled to the inverting input of comparator 22. A capacitor 60 of capacitance Cr, having one end grounded, may be connected to the second bus line 61 through a switch 62 to provide the reference capacitance.

However in measuring small capacitances with the apparatus of FIG. 4, various inherent capacitances associated with integrated circuit switches of array 66 and with the bus 55 appear in parallel with the unknown capacitance Cx or in parallel with the reference capacitance Cr, leading to errors in the value determined for Cx when calculated according to equation [5] above. A capacitance in parallel with Cx would tend to make Cx appear larger than it actually is while capacitance in parallel with Cr would tend to make Cx look smaller than it actually is.

The bus and the switching portions of the circuit of FIG. 4, looking outward from the RCMS 11, are modeled by the equivalent circuit in FIG. 5. The unknown capacitance Cx is selectively connected to the first line 59 and second line 61 of the bus by a pair of switches S1 and S2, representing the multiplexers of the array. A capacitance Cp represents the stray capacitance between the first line 59 and ground along with other inherent capacitances in the system in parallel with the excitation voltage source. The capacitance Cp does not introduce any error into the measurement of capacitance Cx since it is charged to the level of the excitation source and does not affect the measured ratio of voltages Vx and Vr.

An offset capacitance Cf represents all of the stray capacitance of the measurement apparatus appearing in parallel with Cx, including the capacitance between the first and second lines of bus 55, while a capacitance Ca represents all of the capacitance of the apparatus appearing in parallel with reference capacitance Cr, including the capacitance between the line 61 and ground and inherent capacitances to ground associated with the S2 multiplexer switch and associated probe leads. If array 66 in FIG. 4 is implemented monolithically, all of the multiplexers of the array have similar capacitance characteristics, and if all of the probe leads from the device under test to each multiplexer of array 66 are of the same length, then the values of the Ca and Cf capacitances remain relatively constant regardless of which multiplexers of the array connect the unknown capacitance Cx to the bus 55.

The first and second lines of bus 55 may be selectively coupled via a switch 58 and a capacitor 56 of known reference magnitude Cra to provide an auxiliary reference capacitance, while the second line 61 may be coupled to ground through capacitor 60 (reference capacitance Cr) in series with a switch 62.

The Ca and Cf capacitances affect the ratio of voltages Vx and Vr, particularly when Cx is very small, and therefore Ca and Cf are measured and taken into account when calculating Cx on the basis of an RCMS measurement. To measure Ca, switches 57 and 62 are opened, switches S1 and S2 are opened, and switch 58 is closed so that the reference voltage Vr appears across the series combination of capacitances Cra and Ca. The value of Ca can be determined from the resulting final RCMS output N according to the following expression:

$$Ca = (Cra/N)(2^n - N) \qquad [10]$$

With the value of capacitance Ca known, the value of capacitance Cf can then be determined by opening switches 58, 62, S1 and S2, closing switch 57, and substituting the resulting RCMS output N into the following expression:

$$Cf = CaN/(2^n - N) \qquad [11]$$

With Ca and Cf known, the value of small unknown capacitances Cx can be most accurately determined by performing an RCMS measurement using only the small inherent capacitance Ca as a reference capacitance, with switch 62 opened to disconnect capacitor 60 from the second line 61, and with switches 57 and the appropriate switches S1 and S2 closed to connect the selected capacitance Cx to the RCMS input. Cx is then computed from the resulting final RCMS output N according to the following expression:

$$Cx = (CaN/(2^n - N)) - Cf \qquad [12]$$

To provide for a narrower range of capacitance measurements for a given range of RCMS outputs N, the Cr capacitance 60 may also be added in parallel with Ca by closing switch 62, thereby increasing the magnitude of the reference capacitance used in the RCMS measurement. Cx is then computed from the RCMS output according to the following equation:

$$Cx = ((Ca + Cr)N/(2^n - N)) - Cf \qquad [13]$$

To perform accurate Cx measurements at the picofarad level, the offset capacitance Cf should be accurately determined. Much of the offset capacitance arises from parasitic capacitance associated with solid state switches of the multiplexer array and this parasitic capacitance can vary several tens of picofarads depending on the excitation voltage used to make the measurement. This variation in capacitance arises as a result of the varactor phenomena wherein nonlinearly graded doping distributions in the depletion layer around pn junctions in a solid state switch give rise to a voltage dependent junction capacitance. Since the offset capacitance Cf is partly due to such junction capacitance, Cf is voltage dependent. Consequently the RCMS measurement of Cx should be conducted using the same excitation voltage used in measuring Cf.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for measuring the magnitude of an unknown capacitance utilizing a ratiometric capacitance measurement apparatus adapted to measure the magnitude of a capacitor relative to a known capacitance coupled to said capacitor, the method comprising the steps of:
coupling said apparatus to said unknown capacitance; and
utilizing said apparatus to measure the magnitude of said unknown capacitance relative to said known capacitance wherein said known capacitance is the inherent capacitance coupling said capacitance mesurement device to a point of common reference potential.

2. The method of determining the value of an unknown capacitance connectable between first and second terminals of a switching network respectively coupled by said switching network to first and second terminals of a measurement means adapted to measure an unknown impedance connected thereto ratiometrically by comparing the voltage drop across said unknown impedence with the voltage drop across a know reference impedance coupled between the second terminal of said measurement means and a point of common reference potential, there being a first inherent capacitance appearing between the first and second terminals of said switching network and a second inherent capacitance appearing between the second terminal of said switching network and the point of common reference potential, said method comprising:
a. measuring the value of said second inherent capacitance by disconnecting the first terminal of said switching network from the first terminal of said mesurement means, coupling an auxiliary reference capacitance across the terminals of said measurement means, applying a voltage to the first terminal of said measurement means, and comparing the voltage at said second terminal with the voltage between the first and second terminals of said measurement means to determine the value of said second inherent capacitance ratiometrically;
b. measuring the value of said first inherent capacitance by applying a voltage to said first terminal of said mesurement means with the last mentioned terminal coupled to the first terminal of said switching network, and comparing the voltage at the second terminal with the voltage between the first and second terminals of said mesurement means to determine the value of said first inherent capacitance ratiometrically; and
c. measuring the value of said unknown capacitance by coupling the unknown capacitance across the first and second terminals of the switching network, applying a voltage to said first terminal of said measurement means with the last mentioned terminal coupled to the first terminal of said switching network, comparing the voltage at the second terminal with the voltage between the first and second terminals of said measurement means to determine the value of the combination of said unknown capacitance and said first inherent capacitance ratiometrically, and subtracting the value of said first inherent capacitance wherein the second inherent capacitance determined in step a is employed as the ratiometric reference impedance in step b.

3. The method of determining the value of an unknown capacitance connectable between first and second terminals of a switching network respectively coupled by said switching network to first and second terminals of a measurement means adapted to measure an unknown impedance connected therto ratiometrically by comparing the voltage drop across said unknown impedance with the voltage drop across a known reference impedance coupled between the second terminal of said measurement means and a point of common reference potential, there being a first inherent capacitance appearing between the first and second terminals of said switching network and a second inherent capacitance appearing between the second terminal of said switching network and the point of common reference potential, said method comprising:
a. measuring the value of said second inherent capacitance by disconnecting the first terminal of said switching network from the first terminal of said measurement means, coupling an auxiliary reference capacitance across the terminals of said mesurement means, applying a voltage to the first terminal of said mesurement means, and comparing the voltage at said second terminal with the voltage between the first and second terminals of said measurement means to determine the value of said second inherent capacitance ratiometrically;
b. measuring the value of said first inherent capacitance by applying a voltage to said first terminal of said mesurement means with the last mentioned terminal coupled to the first terminal of said switching network, and comparing the voltage at the second terminal with the voltage between the first and second terminals of said measurement means to determine the value of said first inherent capacitance ratiometrically; and
c. measuring the value of said unknown capacitance by coupling the unknown capacitance across the first and second terminals of the switching network, applying a voltage to said first terminal of said measurement means with the last mentioned terminal coupled to the first terminal of said switching network, comparing the voltage at the second terminal with the voltage between the first and second terminals of said measurement means to determine the value of the combination of said unknown capacitance and said first inherent capacitance ratiometrically, and subtracting the value of said first inherent capacitance wherein the second inherent capacitance determined in step a is employed as the ratiometric reference impedance in step c.

4. The method of determining the ratio of a first capacitance and a second capacitance for ascertaining the value of one of them, wherein the first capacitance is adapted to be coupled via a first conductor and a second conductor to a measuring means, while said second capacitance is adapted to be coupled between the second conductor and a point of common reference potential, the conductors being characterized by inherent capacitance; comprising:
disconnecting the first conductor, coupling an auxiliary reference capacitance across the measuring means, and measuring a first inherent capacitance between the second conductor and the point of common reference potential in proportion to said auxiliary reference capacitance;

reconnecting the first conductor and measuring a second inherent capacitance between the conductors in proportion to said first inherent capacitance used as a reference; and coupling said first capacitance across said conductors and measuring the combination of said first capacitance and said second inherent capacitance in proportion to said first inherent capacitance.

5. An apparatus for determining the value of an unknown capacitance connectable between first and second terminals by a switching network, there being a first inherent capacitance appearing between the first and second terminals of said switching network and a second inherent capacitance appearing between the second terminal of said switching network and a point of common reference potential, said apparatus comprising:

means to selectively connect the unknown capacitance between the first and second terminals;

means to generate a reference voltage;

means to measure a second voltage at said second terminal;

a reference capacitance;

means to selectively couple the reference voltage to the second terminal through the reference capacitance, thereby allowing measurement of said second voltage at the second terminal according to the relative magnitudes of the reference capacitance and the second inherent capacitance when the unknown capacitance is not connected between said terminals; and means to selectively apply the reference voltage to the first terminal thereby allowing measurement of the second voltage at the second terminal according to the relative magnitudes of the first and second inherent capacitances when the unknown capacitance is not connected between said terminals, and according to the relative magnitudes of the unknown, the first and second inherent capacitances when the unknown capacitance is connected between said terminals.

6. An apparatus as in claim 5 wherein the means to measure the second voltage comprises:

programmable attenuating means receiving the reference voltage as an input for attenuation, the programmable attenuating means having a plurality of attenuation determining inputs ranked in predetermined digital order;

a successive approximation register adapted to provide a succession of digital outputs having successive values wherein said digital outputs are coupled to provide the attenuation determining inputs for the programmable attenuation means; and means to compare the output of the programmable attenuating means with the second voltage to supply a conversion determining input to the successive approximation register for bringing the voltage reference as attenuated into fixed relation with the second voltage so that the final digital output of the successive approximation register is indicative of the magnitude of the second voltage in relation to the magnitude of the reference voltage.

7. An apparatus for determining the value of an unknown capacitance comprising:

means providing a reference voltage;

programmable attenuating means receiving said voltage reference as an input for attenuation, said programmable attenuation means having a plurality of attenuation determining inputs ranked in predetermined digital order;

a successive approximation register adapted to provide a succession of digital outputs having successive values wherein said digital outputs are coupled to provide the attenuation determining inputs for said programmable attenuation means;

first and second conductors;

means to selectively apply said reference voltage to said first conductor;

means to selectively couple said unknown capacitance across said first and second conductors, said second conductor being coupled to a point of common reference potential through an inherent capacitance associated with said coupling means and said second conductor; and means to compare the output of said programmable attenuating means with a voltage appearing on said second conductor, to supply a conversion determining input to said successive approximation register for bringing said voltage reference as attenuated into fixed relation with said voltage on said second conductor, so that when said reference voltage is applied to said first conductor and said unknown capacitance is coupled across said first and second conductors, the final digital output of said successive approximation register is indicative of the value of said unknown capacitance in relation to the value of said inherent capacitance.

8. The method of determining the ratio of a first capacitance and a second capacitance for ascertaining the value of one of them, wherein the first capacitance is adapted to be coupled via a first conductor and a second conductor to a measuring means, while said second capacitance is adapted to be coupled between the second conductor and a point of reference potential, the conductors being characterized by inherent capacitance; comprising:

disconnecting the first conductor, coupling an auxiliary reference capacitance across the measuring means, and measuring an inherent capacitance between the second conductor and the point of common reference potential in proportion to said auxiliary reference capacitance; and coupling said first capacitance across said conductors and measuring a capacitance in proportion to at least said inherent capacitance with said measuring means.

9. The method of claim 8 including adding a further reference capacitance in parallel with said inherent capacitance.

10. The method according to claim 1 further comprising the steps of:

coupling a reference capacitance to said apparatus as said known capacitance, and utilizing said apparatus to measure the magnitude of said inherent capacitance relative to said reference capacitance.

* * * * *